(12) United States Patent
Kim et al.

(10) Patent No.: US 11,189,815 B2
(45) Date of Patent: Nov. 30, 2021

(54) DISPLAY PANEL

(71) Applicant: LG DISPLAY CO., LTD., Seoul (KR)

(72) Inventors: Mi-Na Kim, Gyeonggi-do (KR);
JungSun Baek, Gyeonggi-do (KR);
Seongjoo Lee, Gyeonggi-do (KR);
Sunmi Lee, Gyeonggi-do (KR);
Namseok Yoo, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/716,309

(22) Filed: Dec. 16, 2019

(65) Prior Publication Data
US 2020/0194713 A1 Jun. 18, 2020

(30) Foreign Application Priority Data
Dec. 17, 2018 (KR) .................. 10-2018-0163604

(51) Int. Cl.
*H01L 51/52* (2006.01)
*H01L 27/32* (2006.01)

(52) U.S. Cl.
CPC ...... *H01L 51/5218* (2013.01); *H01L 27/3246* (2013.01); *H01L 27/3258* (2013.01); *H01L 51/5209* (2013.01); *H01L 51/5271* (2013.01); *H01L 27/3211* (2013.01); *H01L 27/3276* (2013.01)

(58) Field of Classification Search
None
See application file for complete search history.

(56) References Cited

U.S. PATENT DOCUMENTS

| 2012/0223346 | A1* | 9/2012 | Ohsawa .............. H01L 27/322 257/89 |
| 2013/0187163 | A1 | 7/2013 | Kim et al. |
| 2015/0060820 | A1 | 3/2015 | Takagi et al. |

(Continued)

FOREIGN PATENT DOCUMENTS

| CN | 104396345 A | 3/2015 |
| CN | 105870154 A | 8/2016 |

(Continued)

*Primary Examiner* — Steven B Gauthier
(74) *Attorney, Agent, or Firm* — Birch, Stewart, Kolasch & Birch, LLP

(57) ABSTRACT

A display panel can include a substrate including first, second and third subpixels; an overcoat layer including a first inclined surface in at least one of the first, second and third subpixels; first, second and third anode electrodes corresponding to the first, second and third subpixels, respectively, wherein at least one of the first, second and third anode electrodes includes a second inclined surface overlapping with the first inclined surface of the overcoat layer; first, second and third organic light emitting layers disposed on the first, second and third anode electrodes, respectively; and a bank layer disposed on the overcoat layer, the bank layer including a third inclined surface overlapping with both the first and second inclined surfaces of the overcoat layer and the at least one of the first, second and third anode electrodes, in which at least one of the first, second and third inclined surfaces is configured to reflect light emitted from a corresponding one of the first, second and third organic light emitting layers.

20 Claims, 13 Drawing Sheets

(56) References Cited

U.S. PATENT DOCUMENTS

| | | | |
|---|---|---|---|
| 2015/0090983 A1* | 4/2015 | Ozawa | H01L 27/3279 |
| | | | 257/40 |
| 2016/0365390 A1* | 12/2016 | Hsu | H01L 27/124 |
| 2017/0125740 A1 | 5/2017 | Lee et al. | |
| 2017/0213882 A1 | 7/2017 | Teramoto et al. | |
| 2018/0150164 A1* | 5/2018 | Naganuma | H01L 27/323 |
| 2018/0211979 A1* | 7/2018 | Lee | H01L 51/5209 |
| 2020/0035769 A1* | 1/2020 | Youn | H01L 27/3213 |
| 2020/0194509 A1* | 6/2020 | Beak | H01L 51/5209 |
| 2020/0194711 A1* | 6/2020 | Kim | H01L 51/5209 |

FOREIGN PATENT DOCUMENTS

| | | |
|---|---|---|
| CN | 106992203 A | 7/2017 |
| EP | 3 361 509 A1 | 8/2018 |
| JP | 2012-113934 A | 6/2012 |
| JP | 2015-50011 A | 3/2015 |
| JP | 2017-91802 A | 5/2017 |
| JP | 2017-135243 A | 8/2017 |
| KR | 10-2013-0007421 A | 1/2013 |
| KR | 10-2017-0015732 A | 2/2017 |
| KR | 10-2018-0036465 A | 4/2018 |
| KR | 10-2018-0078128 A | 7/2018 |
| KR | 10-2018-0087908 A | 8/2018 |
| TW | 201826546 A | 7/2018 |

\* cited by examiner

DISPLAY PANEL

CROSS-REFERENCE TO RELATED APPLICATION

This application claims the priority benefit of Republic of Korea Patent Application No. 10-2018-0163604, filed in the Republic of Korea on Dec. 17, 2018, the disclosure of which is incorporated herein by reference in its entirety.

BACKGROUND

Field of the Disclosure

The present disclosure relates to a display panel and a display device including the same.

Description of the Background

Since the advent of the information society, there have been growing needs for various display panels for using in display devices, lighting devices, or the like. Among various types of display panels, an organic light emitting display panel is advantageous in a reduction in overall weight and thickness, since an additional backlight source is not required. As a result, demands for organic light emitting display panels have increased steadily.

However, when the organic light emitting display panel including an organic light emitting layer emitting light is operated, there is a problem that a light extraction efficiency of the organic light emitting display panel is lowered and corresponding luminance efficiency is lowered because some of the light emitted from the organic light emitting layer cannot be emitted outside the organic light emitting display panel, and therefore trapped inside the organic light emitting display device.

In addition, much research is being carried out to solve a problem that causes an image distortion according to angles of view of the display panel.

SUMMARY

To address these issues, at least one object of the present disclosure is to provide a display panel and a display device with enhanced luminance efficiency.

It is at least one object of the present disclosure to provide a display panel and a display device with a reduced color shift for different viewing angles.

In accordance with an aspect of the present disclosure, a display panel includes a substrate, an overcoat layer, a first anode electrode, a second anode electrode, a third anode electrode, a bank layer, a first organic light emitting layer, a second organic light emitting layer, a third organic light emitting layer, and a cathode electrode.

The substrate can be subdivided into areas corresponding to a first subpixel, a second subpixel and a third subpixel.

The first subpixel emits visible light of a first color, the second subpixel emits visible light of a second color, and the third subpixel emits visible light of a third color. Each of the first, second and third colors can be different from one another.

The overcoat layer can be located over the substrate, and include a convex area and a concave area, which are connected to each other through an inclined area.

The inclined area can include a first inclined surface surrounding the concave area in at least one of the first, second and third subpixels.

The first anode electrode can be located over the overcoat layer, formed along with a surface of the overcoat layer, and located in the first subpixel.

The second anode electrode can be located over the overcoat layer, formed along with the surface of the overcoat layer, and located in the second subpixel.

The third anode electrode can be located over the overcoat layer, formed along with the surface of the overcoat layer, and located in the third subpixel.

The bank layer includes an open area located in the center area of each of the first, second and third subpixels, and can be located on the overcoat layer and the first, second and third anode electrodes.

The first organic light emitting layer can be located on a part of the first anode electrode located in the open area of the bank layer.

The second organic light emitting layer can be located on a part of the second anode electrode located in the open area of the bank layer.

The third organic light emitting layer can be located on a part of the third anode electrode located in the open area of the bank layer.

The cathode electrode can be located on the first, second and third organic light emitting layers and the bank layer.

At least one of the first, second and third anode electrodes can include a second inclined surface formed along with the first inclined surface.

The bank layer can include a third inclined surface formed along with the second inclined surface.

An angle of the first inclined surface to the concave area can be greater than or equal to 27°.

A distance between the second inclined surface and third inclined surface is less than or equal to 3.2 μm.

A height of the first inclined surface can be greater than or equal to 0.7 μm.

The display panel can include two types of areas, which include an opening area corresponding to the open area of the bank layer and a non-opening area corresponding to a remaining area except for the open area of the bank layer.

When an organic light emitting layer in a subpixel including the first inclined surface emits light, the display panel can include a first light emitting area and a second light emitting area.

Visible light is emitted from the first light emitting area. The first light emitting area can have a shape corresponding to a shape of the opening area.

The second light emitting area does not overlap the first light emitting area. The second light emitting area can have a shape corresponding to a shape of an edge of the first light emitting area.

The second light emitting area can surround the first light emitting area.

The second light emitting area can be located in the non-opening area.

Color coordinates of visible light emitted from the first light emitting area can be different from color coordinates of visible light emitted from the second light emitting area adjacent to the first light emitting area.

At least one of the first, second and third organic light emitting layers can extend to a portion of the bank layer.

In the at least one of the first, second and third organic light emitting layers extending to the portion of the bank layer, a portion formed on the anode electrode can be thicker than a portion formed on the third inclined surface of the bank layer.

The incline area can include the first inclined surface surrounding the concave area in at least one of the first subpixel and the second subpixel.

The visible light of the first color can be a red visible light having a wavelength of 595 nm to 740 nm.

The visible light of the second color may be a green visible light having a wavelength of 495 nm to 595 nm.

The visible light of the third color can be a blue visible light having a wavelength of 450 nm to 495 nm.

The overcoat layer can include the first inclined surface in at least two of the first, second and third subpixels, and an angle of the first inclined surface included in each of the first, second and third subpixels can be different from one another, and a distance between the second inclined surface and the third inclined surface in each of the first, second and third subpixels can be different from one another.

The overcoat layer can include the first inclined surface in at least two of the first, second and third subpixels, and a height of the first inclined surface included in each of the first, second and third subpixels can be different from one another.

In accordance with embodiments of the present disclosure, the anode electrode can be formed of the inclined surface, and as a result, it is possible to provide a display panel with high luminous efficiency.

DETAILED DESCRIPTION

Figure 1:
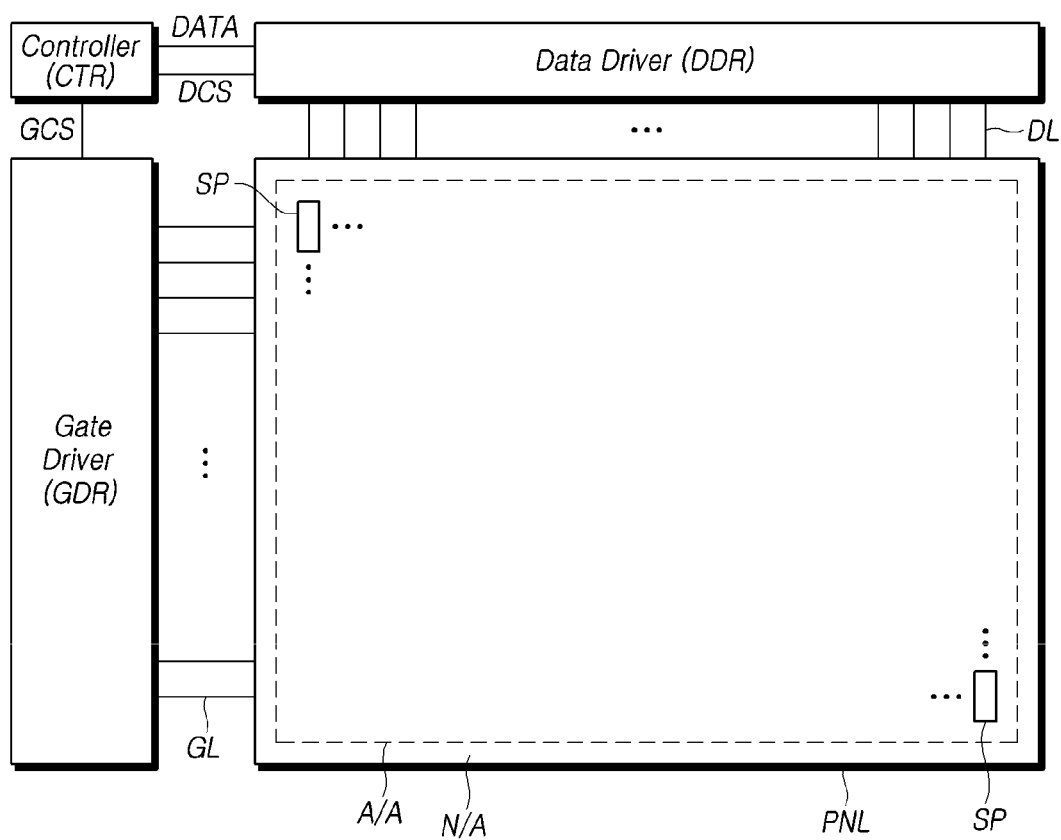
FIG. 1 is a block diagram schematically illustrating a configuration of a display device according to embodiments of the present disclosure.

Hereinafter, example embodiments of the disclosure will be described in detail with reference to the accompanying drawings. In denoting elements of the drawings by reference numerals, the same elements will be referenced by the same reference numerals although the elements are illustrated in different drawings. Further, in the following description of the disclosure, detailed description of known functions and configurations incorporated herein may be omitted when it may make the subject matter of the disclosure rather unclear.

Terms, such as first, second, A, B, (a), or (b) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element. When it is described that an element is "located," "disposed," "arranged," "formed," or the like over another element, it should be interpreted that not only the element is directly contacted on the another element, but further another element may be "interposed" between the element and the another element.

FIG. 1 is a block diagram schematically illustrating a configuration of a display device according to embodiments of the present disclosure.

The display device according to embodiments of the present disclosure can be a display device with a display panel, or can further include or be included in a lighting device/apparatus/system, a luminescence device/apparatus/system, or the like. Hereinafter, for convenience of description and ease of understanding, discussions are conducted based on the display device with the display panel. However, the following description may be applicable to equivalently or similarly to various devices/apparatuses/systems with functionalities for displaying images, such as, the lighting device/apparatus/system, the luminescence device/apparatus/system, or the like.

In accordance with embodiments of the present disclosure, the display device can include a panel (PNL) for displaying images or outputting light, and a driving circuit (or a driver) for driving the panel (PNL).

The panel (PNL) can include a plurality of data lines (DL) and a plurality of gate lines (GL), and include a plurality of subpixels (SP) that is defined by the plurality of data lines (DL) and the plurality of gate lines (GL) and that is arranged in a matrix pattern.

The plurality of data lines (DL) and the plurality of gate lines (GL) can be arranged to intersect each other in the panel (PNL). For example, the plurality of gate lines (GL) can be arranged in a first direction or on one of a row or a column, and the plurality of data lines (DL) can be arranged in a second direction or on the other of the row or the column. Hereinafter, for convenience of description and ease of understanding, it may be considered that the plurality of gate lines (GL) is arranged on one or more rows and the plurality of data lines (DL) is arranged on one or more columns.

The panel (PNL) can include other types of signal lines other than the plurality of data lines (DL) and the plurality of gate lines (GL) according to a structure of a subpixel, etc. For example, the display panel can further include at least one driving voltage line, at least one reference voltage line, at least one common voltage line, or the like.

The panel (PNL) can be various types of panel, such as, a liquid crystal display (LCD) panel, an organic light emitting diode (OLED) panel, or the like.

For example, different types of signal lines can be disposed in the panel (PNL) depending on a structure of subpixels, a type of panel (e.g., an LCD panel, an OLED panel, etc.), or the like. In the present disclosure, the signal line may denote a term including an electrode to which a signal is applied.

The panel PNL can include an active area (A/A) displaying an image and a non-active area (N/A) not displaying an image and located in an edge area. Here, the non-active area (N/A) can be referred to as a bezel area or the edge area of the panel or the display device.

A plurality of subpixels (SP) is arranged in the active area (A/A) for displaying images.

At least one pad, such as a conductive trace, electrically connected to a data driver (DDR) is disposed in the non-active area (N/A), and a plurality of data link lines can be disposed in the non-active area (N/A) for electrically connecting the pad to the plurality of data lines (DL). In this situation, the plurality of data link lines can be a part of the plurality of data lines (DL) extending to the non-active area (N/A), or be separate patterns electrically connected to the plurality of data lines (DL).

In addition, the non-active area (N/A) further can include gate-driving-related lines for delivering a voltage (signal) for driving at least one gate of at least one transistor for driving at least one subpixel from the pad electrically connected to the data driver (DDR) to a gate driver (GDR). For example, the gate-driving-related lines can include clock lines for delivering clock signals, gate voltage lines for delivering gate voltages (VGH, VGL), gate driving control signal lines for delivering various control signals for generating scan signals, or the like. The gate-driving-related lines are arranged in the non-active area (N/A), unlike gate lines (GL) arranged in the active area (A/A).

The driving circuit can include the data driver (DDR) for driving the plurality of data lines (DL), the gate driver (GDR) for driving the plurality of gate lines (GL), and a controller (CTR) for controlling the data driver (DDR) and the gate driver (GDR).

The data driver (DDR) can drive the plurality of data lines (DL) by outputting data voltages to the plurality of data lines (DL).

The gate driver (GDR) can drive the plurality of gate lines (GL) by outputting scan signals to the plurality of gate lines (GL).

The controller (CTR) can provide various control signals (DCS), (GCS) for driving and/or operating the data driver (DDR) and the gate driver (GDR), and control the driving and/or operating of the data driver (DDR) and the gate driver (GDR). In addition, the controller (CTR) can provide image data (DATA) to the data driver (DDR).

The controller (CTR) starts scanning operation according to timing processed in each frame, converts image data input from other devices or image providing sources to a data signal form used in the data driver (DDR) and then outputs image data (DATA) resulted from the converting, and controls the driving of at least one data line at a pre-configured time aligned with the scanning operation.

In order to control the data driver (DDR) and the gate driver (GDR), the controller (CTR) receives a timing signal, such as, a vertical synchronous signal (Vsync), a horizontal synchronous signal (Hsync), an input data enable (DE) signal, a clock signal (CLK), or the like, from other devices or image providing sources, such as, a host system, and generates various control signals and outputs the generated signals to the data driver (DDR) and the gate driver (GDR).

For example, to control the gate driver (GDR), the controller (CTR) outputs various gate control signals (GCS) including a gate start pulse (GSP), a gate shift clock (GSC), a gate output enable (GOE) signal, or the like.

In addition, to control data driver (DDR), the controller (CTR) outputs various data control signals (DCS) including a source start pulse (SSP), a source sampling clock (SSC), a source output enable (SOE) signal, or the like.

The controller (CTR) can be a timing controller used in the typical display technology or a control apparatus/device capable of additionally performing other control functionalities in addition to the typical function of the timing controller.

The controller (CTR) can be implemented as a separate unit from the data driver (DDR), or integrated with the data driver (DDR) and implemented as an integrated circuit.

The data driver (DDR) receives image data (DATA) from the controller (CTR), and provides data voltages to the plurality of data lines (DL). Thus, the data driver (DDR) drives the plurality of data lines (DL). Herein, the data driver (DDR) may also be referred to as a "source driver."

The data driver (DDR) can transmit various signals to and/or receive them from the controller (CTR) through various interfaces.

The gate driver (GDR) sequentially drives the plurality of gate lines (GL) by sequentially providing scan signals to the plurality of gate lines (GL). Herein, the gate driver (GDR) may also be referred to as a "scan driver."

According to controlling of the controller (CTR), the gate driver (GDR) sequentially provide a scan signal, such as an on-voltage or an off-voltage to the plurality of gate lines (GL).

When a specific gate line is asserted by a scan signal from the gate driver (GDR), the data driver (DDR) converts image data (DATA) received from the controller into analog data voltages and provides the resulted analog data voltages to the plurality of data lines (DL).

The data driver (DDR) can be located on, but not limited to, only one side (e.g., an upper side or a lower side) of the panel (PNL), or in some embodiments, be located on, but not limited to, two sides (e.g., an upper side and a lower side) of the panel (PNL) according to driving schemes, panel design schemes, or the like.

The gate driver (GDR) can be located on, but not limited to, only one side (e.g., a left side or a right side) of the panel (PNL), or in some embodiments, be located on, but not limited to, two sides (e.g., a left side and a right side) of the panel (PNL) according to driving schemes, panel design schemes, or the like.

The data driver (DDR) can be implemented by including one or more source driver integrated circuits (SDIC).

Each source driver integrated circuit (SDIC) can include a shift register, a latch circuit, a digital to analog converter (DAC), an output buffer, or the like. In some embodiments, the data driver (DDR) can further include one or more analog to digital converters (ADC).

Each source driver integrated circuit (SDIC) can be connected to the pad, such as a bonding pad, of the panel (PNL) in a tape automated bonding (TAB) type or a chip on glass (COG) type, or be directly disposed on the panel (PNL). In some instances, each source driver integrated circuit (SDIC) can be integrated and disposed on the panel (PNL). In addition, each source driver integrated circuit (SDIC) can be implemented in a chip on film (COF) type. In this case, each source driver integrated circuit (SDIC) can be mounted on a circuit film and electrically connected to the data lines (DL) arranged in the panel (PNL) through the circuit film.

The gate driver (GDR) can include a plurality of gate driving circuits (GDC). Herein, the plurality of gate driving circuits (GDC) each can correspond to the respective plurality of gate lines (GL).

Each gate driving circuit (GDC) can include a shift register, a level shifter, and the like.

Each gate driving circuit (GDC) can be connected to the pad, such as a bonding pad, of the panel (PNL) in a tape automated bonding (TAB) type or a chip on glass (COG) type. In addition, each gate driving circuit (GDC) can be implemented in a chip on film (COF) type. In this situation, each gate driving circuit (GDC) can be mounted on a circuit film and electrically connected to the gate lines (GL) arranged in the panel (PNL) through the circuit film. In addition, each gate driving circuit (GDC) may be integrated into the panel (PNL) in a gate in panel (GIP) type. That is, each gate driving circuit (GDC) may be directly formed in the panel (PNL).

Figure 2:
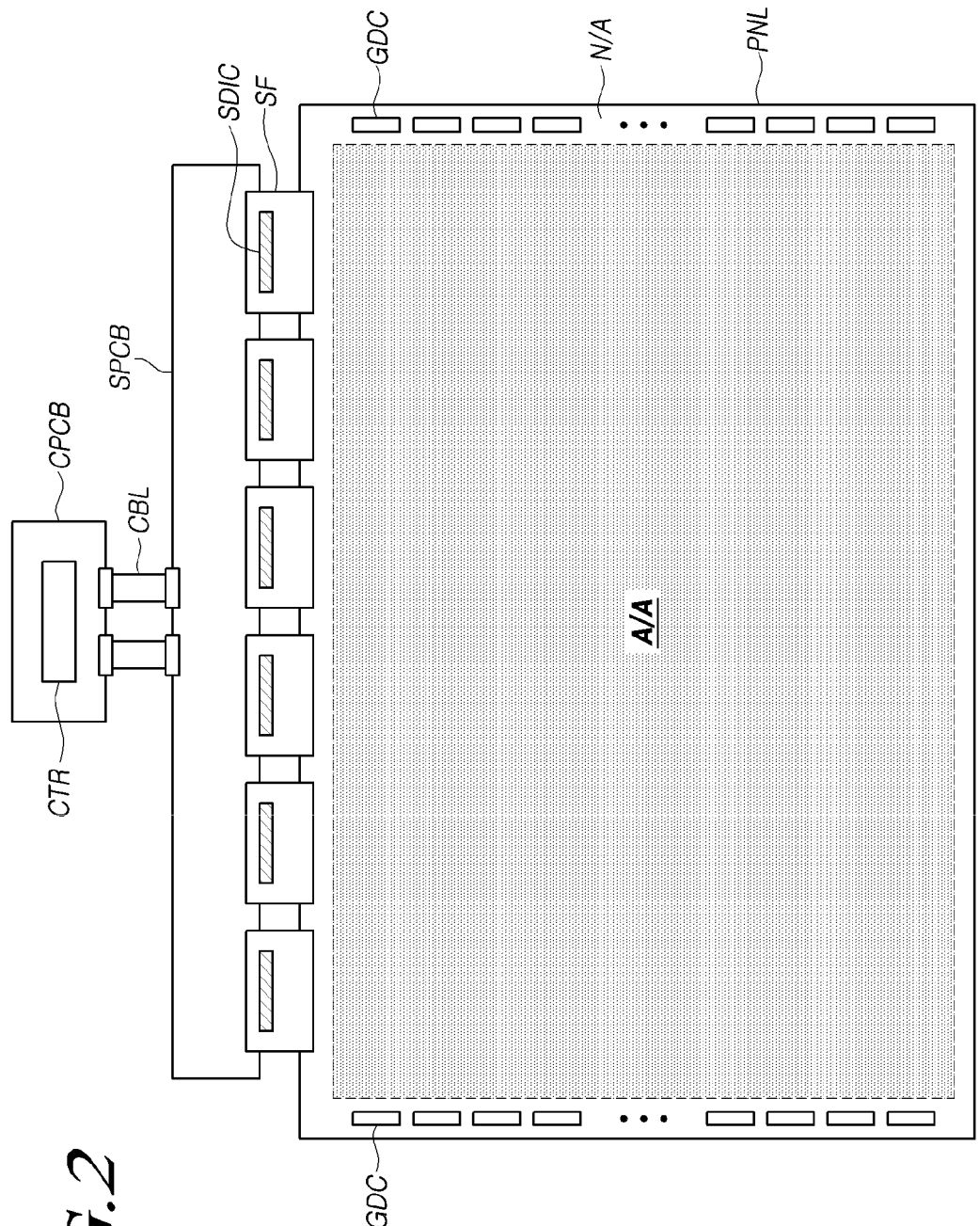
FIG. 2 is a view schematically illustrating a system implementation of the display device according to embodiments of the present disclosure.

FIG. 2 is a view illustrating a structure of a subpixel, in which the display panel is configured with an organic light emitting diode (OLED) panel according to embodiments of the present disclosure.

Referring to FIG. 2, each subpixel (SP) in a panel, such as the OLED panel 110, can be implemented by electronic elements including, but not limited to, an organic light emitting diode (OLED), a driving transistor (DRT) for driving the organic light emitting diode (OLED), a switching transistor (O-SWT) electrically connected between a first node (N1) of the driving transistor (DRT) and a corresponding data line (DL), a storage capacitor (Cst) electrically connected between the first node (N1) and a second node (N2) of the driving transistor (DRT), or the like.

The organic light emitting diode (OLED) can include an anode electrode, an organic light emitting layer, a cathode electrode, and the like.

FIG. 2 is a view schematically illustrating a system implementation of the display device according to embodiments of the present disclosure.

Referring to FIG. 2, in a display device according to embodiments of the present disclosure, a data driver (DDR) may be implemented in the chip on film (COF) type of various types, such as, the TAB, the COG, the COF, the GIP, or the like. Also, a gate driver (GDR) may be implemented in the gate in panel (GIP) type of various types, such as, the TAB, the COG, the COF, the GIP, or the like.

The data driver (DDR) can be implemented as one or more source driver integrated circuits (SDIC). FIG. 2 shows an embodiment in which the data driver (DDR) is implemented as a plurality of source driving integrated circuits (SDIC).

When the data driver (DDR) is implemented in the COF type, each source driving integrated circuit (SDIC) served as the data driver (DDR) can be mounted on a source side circuit film (SF).

One side of the source side circuit film (SF) can be electrically connected to the pad, such as an array of pads, disposed in the non-active area (N/A).

At least one line electrically connecting between the source driving integrated circuit (SDIC) and the panel (PNL) can be arranged on the source side circuit film (SF).

For circuit connections between the plurality of source driving integrated circuits (SDIC) and other units or electronic elements, the display device can include at least one source printed circuit board (SPCB), and a control printed circuit board (CPCB) for mounting several units used for controlling the display device and other elements/units/devices.

The other side of the source side circuit film (SF), in which the source driving integrated circuit (SDIC) is mounted, can be connected to the at least one source printed circuit board (SPCB).

That is, the one side and the other side of the source side circuit film (SF) in which the source driving integrated circuit (SDIC) is mounted can be electrically connected to the non-active area (N/A) of the panel (PNL) and the at least one source printed circuit board (SPCB), respectively.

The controller (CTR) for controlling the data driver (DDR), the gate driver (GDR), or the like can be disposed on the control printed circuit board (CPCB).

In addition, the control printed circuit board (CPCB) can further include a power management integrated circuit (PMIC) that provides various voltages or currents or controls various voltages or currents to be provided, to the panel (PNL), the data driver (DDR), the gate driver (GDR), and the like.

The source printed circuit board (SPCB) and the control printed circuit board (CPCB) can be connected to each other in a circuit through at least one connection unit (CBL). Here, the connection unit (CBL) can be a flexible printed circuit (FPC), a flexible flat cable, or the like.

At least one source printed circuit board (SPCB) and the control printed circuit board (CPCB) can be integrated into one printed circuit board.

When the gate driver (GDR) is implemented in the gate in panel (GIP) type, a plurality of gate driving circuits (GDC) included in the gate driver (GDR) can be directly formed in the non-active area (N/A) of the panel (PNL).

Each of the plurality of gate driving circuits (GDC) can output scan signals to corresponding gate lines arranged in the active area (A/A) of the panel (PNL).

The plurality of gate driving circuits (GDC) arranged in the panel (PNL) can receive various signals (a clock signal, a high level gate voltage (VGH), a low level gate voltage (VGL), a start signal (VST), a reset signal (RST), or the like) for generating the scan signals through gate-driving-related lines disposed in the non-active area (N/A).

The gate-driving-related lines disposed in the non-active area (N/A) can be electrically connected to the source side circuit film (SF) disposed closest to a plurality of gate driving circuits (GDC).

Figure 3:
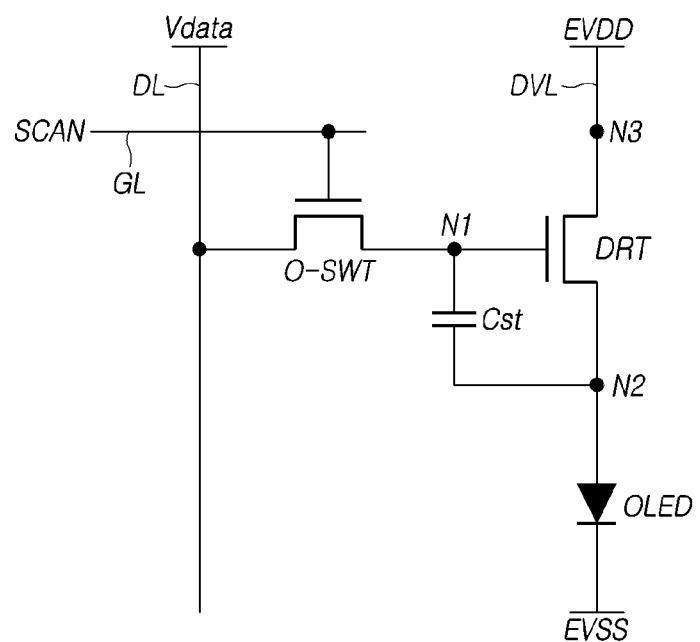
FIG. 3 is a view illustrating a structure of a subpixel in a situation where the display panel is configured with an organic light emitting diode (OLED) panel according to embodiments of the present disclosure.

FIG. 3 is a view illustrating a structure of a subpixel, in which the display panel is configured with an organic light emitting diode (OLED) panel, according to embodiments of the present disclosure.

Referring to FIG. 3, each subpixel SP in the panel 110, such as the OLED panel, can be implemented by electronic elements including, but not limited to, an organic light emitting diode (OLED), a driving transistor (DRT) for driving the organic light emitting diode (OLED), a switching transistor (O-SWT) electrically connected between a first node (N1) of the driving transistor (DRT) and a corresponding data line (DL), a storage capacitor (Cst) electrically connected between the first node (N1) and a second node (N2) of the driving transistor (DRT), or the like.

The organic light emitting diode (OLED) can include an anode electrode, an organic light emitting layer, a cathode electrode, and the like.

Referring to FIG. 3, an anode electrode (also referred to as a pixel electrode) of the organic light emitting diode (OLED) can be electrically connected to a second node (N2) of a driving transistor (DRT). A low voltage (EVSS) can be applied to a cathode electrode (also referred to as a common electrode) of the organic light emitting diode (OLED).

Herein, the low voltage (EVSS) can be a ground voltage or a voltage higher or lower than the ground voltage. In addition, a value of the low voltage (EVSS) can be varied depending on a driving state. For example, values of low voltage (EVSS) when image driving is performed and when sensing driving is performed can be differently set from each other.

The driving transistor (DRT) drives the organic light emitting diode (OLED) by providing driving currents to the organic light emitting diode (OLED).

The driving transistor (DRT) can include a first node (N1), a second node (N2) a third node (N3), and the like.

The first node (N1) of the driving transistor (DRT) can be a gate node, and can be electrically connected to a source node or a drain node of the switching transistor (O-SWT). The second node (N2) of the driving transistor (DRT) can be a source node or a drain node, and electrically connected to the anode electrode (or cathode electrode) of the organic light emitting diode (OLED). The third node (N3) of the driving transistor (DRT) can be the drain node or the source node. A driving voltage (EVDD) can be applied to the third node (N3) that can be electrically connected to a driving voltage line (DVL) providing the driving voltage (EVDD).

The storage capacitor (Cst) can be electrically connected between the first node (N1) and the second node (N2) of the driving transistor (DRT) and can maintain a data voltage (Vdata) corresponding to an image signal voltage or a corresponding voltage for one frame time (or a pre-configured time).

The drain node or the source node of the switching transistor (O-SWT) is electrically connected to a corresponding data line, and the source node or the drain node of the switching transistor (O-SWT) is electrically connected to the first node (N1) of the driving transistor (DRT), and the gate node of the switching transistor (O-SWT) is electrically connected to a corresponding gate line, and thereby can receive scan signal (SCAN).

On-off operation of the switching transistor (O-SWT) may be controlled by a scan signal (SCAN) input to the gate node of the switching transistor (O-SWT) through a corresponding gate line.

The switching transistor (O-SWT) can be turned on by the scan signal (SCAN), may transfer a data voltage (Vdata) provided from a corresponding data line (DL) to the first node (N1) of the driving transistor (DRT).

In addition, the storage capacitor (Cst) can be an external capacitor configured to be located on outside of the driving transistor (DRT) other than an internal capacitor, that is, a parasitic capacitor (e.g., a Cgs, a Cgd), that presents between the first node (N1) and the second node (N2) of the driving transistor (DRT).

Each of the driving transistor (DRT) and the switching transistor (O-SWT) may be an n-type transistor or a p-type transistor.

As shown in FIG. 3, the subpixel structure with two transistors (2T) and one capacitor (1C) type has been discussed for convenience of discussion, but the embodiments are not limited thereto. In some embodiments, the subpixel can further include at least one transistor and/or at least one capacitor. In some embodiments, a plurality of subpixels can have an identical structure, or at least one or more of the plurality of subpixels can have a different structure from others.

Figure 4:
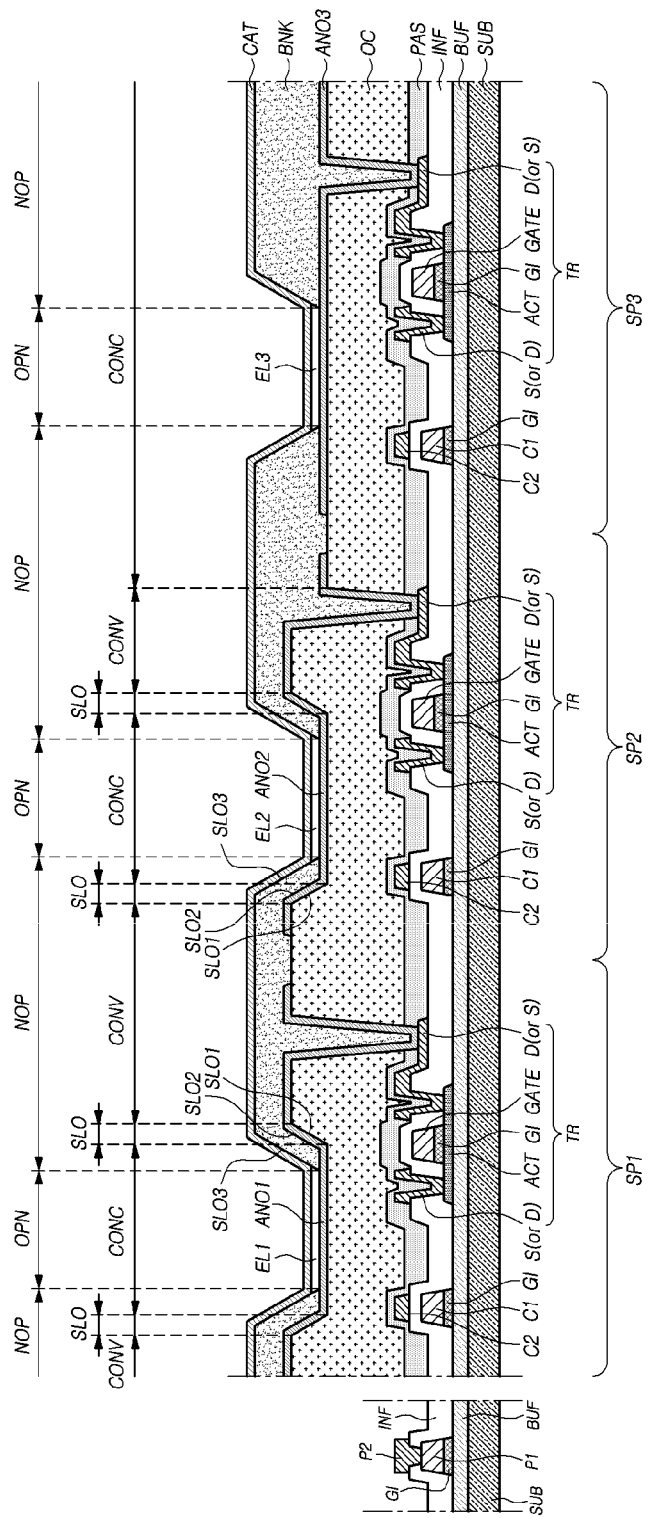
FIG. 4 is a cross-sectional view illustrating the display device according to embodiments of the present disclosure.

FIG. 4 is a cross-sectional view illustrating the display device according to embodiments of the present disclosure.

Referring to FIG. 4, the display panel according to embodiments of the present disclosure can include a substrate (SUB), an overcoat layer (OC) located over the substrate, a first anode electrode (ANO1) located on the overcoat layer, a second anode electrode (ANO2) located on the overcoat layer, a third anode electrode (ANO3) located on the overcoat layer, a bank layer (BNK) located on the overcoat layer and the first, second and third anode electrodes (ANO1, ANO2 and ANO3), a first organic light emitting layer (EL1) located on a part of the first anode electrode, a second organic light emitting layer (EL2) located on a part of the second anode electrode, a third organic light emitting layer (EL3) located on a part of the third anode electrode, and a cathode electrode (CAT) located on at least one of the first, second and third light emitting layers and the bank layer.

The substrate (SUB) can be subdivided into areas corresponding to a first subpixel (SP1), a second subpixel (SP2) and a third subpixel (SP3).

The first subpixel (SP1) can emit visible light of a first color, the second subpixel (SP2) can emit visible light of a second color, and the third subpixel (SP3) can emit visible light of a third color. The first subpixel (SP1), the second subpixel (SP2) and the third subpixel (SP3) can be also defined as a first subpixel type (SP1), a second subpixel type (SP2) and a third subpixel type (SP3), respectively. Accordingly, hereinafter, either the subpixel or the subpixel type will used interchangeably.

The overcoat layer (OC) can denote a layer for planarizing at least one pattern layer disposed over the substrate for forming a pixel. The overcoat layer can include a convex area (CONV) and a concave area (CONC), which are connected to each other through an inclined area (SLO).

The convex area (CONV) can thicker than the concave area (CONC). In defining the convex area (CONV) and the concave area (CONC), the thickness of the convex area (CONV) and the concave area (CONC) denotes a thickness of the overcoat layer. The thickness of the convex area (CONV) and the concave area (CONC) can be defined as a thickness of the overcoat layer measured between a passivation layer (PAS) disposed directly under the overcoat layer (OC) and an anode electrode (ANO) disposed directly on the overcoat layer (OC), in each area, and in particular, can be defined as the thickest thickness of the overcoat layer measured in each area except for a portion in which a contact hole, or the like is introduced.

As shown in FIG. 4, the thickness (T1) of the concave area (CONC) can be smaller than the thickness (T2) of the convex area (CONV). Accordingly, relative to the cross section of the display panel, the concave area (CONC) can be recognized as a flat area of the overcoat layer (OC), and the convex area (CONV) can be recognized as a protruding area.

The inclined area (SLO) can be formed between the convex area (CONV) and the concave area (CONC) due to a difference between the thicknesses of the convex area (CONV) and the concave area (CONC). The convex area (CONV) and the concave area (CONC) can be connected to each other through the inclined area (SLO). The inclined area (SLO) can include a first inclined surface (SLO1) surrounding the concave area (CONC) in at least one of the first, second and third subpixel types (SP1, SP2 and SP3). The at least one of the first, second and third subpixel types (SP1, SP2 and SP3) can denote at least one type of subpixel, in which the type of the subpixel is classified according to a color of light emitted from the subpixel. For example, when a display panel includes a red subpixel, a green subpixel and a blue subpixel, the display panel can be expressed as including three types of subpixel.

The first inclined surface (SLO1) can denote an inclined surface that is an inclined area surrounding the concave area (CONC) of inclined areas (SLO) formed between the convex area (CONV) and the concave area (CONC) of the overcoat layer (OC). Accordingly, in the display panel shown in FIG. 4, the first subpixel (SP1) and the second subpixel (SP2) includes the inclined area, and thus includes the first inclined surface (SLO1). On the other hand, the third subpixel (SP3) does not include the inclined area surrounding the concave area (CONC), and thus does not include the first inclined surface (SLO1).

Since the convex area (CONV) surrounds the concave area (CONC), in the cross section of the display panel, the concave area (CONC) can be located between the convex areas (CONV).

The overcoat layer (OC) including the convex area (CONV), the concave area (CONC) and the inclined area (SLO) can be formed through a photolithography process using a half-tone mask.

There is no restriction to a shape of the concave area (CONC). The shape of the concave area (CONC) may preferably be, but not limited to, a polygonal shape, such as a circle or a square, a pentagon, and an octagon. The convex areas (CONV) can surround the concave area (CONC), and can form a side wall surrounding a side portion of the concave area (CONC) having the shape described above.

The first anode electrode (ANO1), the second anode electrode (ANO2), a third anode electrode (ANO3), formed along a surface of the overcoat layer (OC), can be located on the overcoat layer (OC) located over the substrate.

The forming of the anode electrodes (ANO1, ANO2 and ANO3) along the surface of the overcoat layer (OC) can mean that the anode electrodes are formed on the overcoat layer with a thickness that is considered to be uniform when a thickness variation due to a tolerable process deviation is taken into account (e.g., the anodes can follow the contours of the surface of the overcoat layer).

Each of the first anode electrode (ANO1), the second anode electrode (ANO2) and the third anode electrode (ANO3) can be spaced apart from one another by a certain distance, and can transfer independently a signal to a corresponding subpixel.

As described above, the overcoat layer (OC) can include the first inclined surface (SLO1) surrounding the concave area (CONC) in at least one of the first, second and third subpixel types (SP1, SP2 and SP3). Accordingly, in a situation where the anode electrode is formed along a surface of the first inclined surface (SLO1) that is a part of the surface of the overcoat layer (OC), the anode electrode can also include an inclined surface. In the present disclosure, such an inclined surface of the anode electrode can be referred to as a second inclined surface (SLO2).

In addition, since the anode electrodes (ANO1, ANO2 and ANO3) are formed along the surface of the overcoat layer (OC), the second inclined surface (SLO2) can be a shape surrounding the anode electrode portions formed on the concave area (CONC) of the overcoat layer (OC).

The first, second and third anode electrodes can be electrically connected to one another through a contact hole.

The anode electrode can be an electrode including a reflective electrode. The anode electrode can include a conductive metal oxide layer including indium tin oxide ITO and a reflective metal layer including silver. For example, the anode electrode can include a first indium tin oxide ITO layer located on the overcoat layer, the reflective metal layer including silver located on the first indium tin oxide ITO layer, and a second indium tin oxide ITO layer located on the reflective metal layer.

The anode electrodes can function as anode electrodes in the display panel.

The bank layer (BNK1) may include an open area (BNKO) located in the center area of each of the first, second and third subpixels (SP1, SP2, SP3). The open area (BNKO) of the bank denotes an open area in which the bank layer does not cover the anode electrode, and can denote an area indicated by the OPN as shown in FIG. 4. The open area (BNKO) of the bank denotes an open area formed in the bank layer, in which the anode electrode is exposed by the open area (BNKO) of the bank. The organic light emitting layer and the cathode electrode can be sequentially disposed on the exposed anode electrode. Accordingly, the open area (BNKO) of the bank is provided in the center area of each of the subpixels emitting light, and thus allows the subpixels to emit the light.

The first organic light emitting layer (EL1) can be located on a part of the first anode electrode (ANO1) located in the open area (BNKO) of the bank. The second organic light emitting layer (EL2) can be located on a part of the second anode electrode (ANO2) located in the open area (BNKO) of the bank. The third organic light emitting layer (EL3) can be located on a part of the third anode electrode (ANO3) located in the open area (BNKO) of the bank.

Since the first, second and third organic light emitting layers (EL1, EL2 and EL3) are layers discharging light when an exciton having high energy formed from the recombination of a hole and an electron injected through an anode and a cathode falls into low energy, the first, second and third organic light emitting layers (EL1, EL2 and EL3) can be located on the exposed anode electrodes (ANO1, ANO2, ANO3) not covered by the open area (BNKO) of the bank. The anode electrodes (ANO1, ANO2, and ANO3) can be an anode.

The cathode electrode (CAT) can be located on the organic light emitting layer (EL1, EL2, EL3) and the bank layer (BNK). The display panel can be a top emission type in which light emitted from the organic light emitting layer (EL1, EL2, EL3) is emitted through the cathode electrode (CAT). Accordingly, the cathode electrode (CAT) can be a transparent electrode with excellent transmittance to light in the visible light region, and the bank layer (BNK) can perform a function as a layer for distinguishing between an opening area (OPN) and a non-opening area (NOP) of the display panel.

As described above, the display panel in the present disclosure can include two different types of areas, which are the opening area (OPN) and the non-opening area (NOP) subdivided by the configuration of the bank layer (BNK). The opening area (OPN) can correspond to the open area (BNKO) of the bank, and the non-opening area (NOP) can correspond to the bank layer (BNK) except for the open area (BNKO). The opening area (OPN) and the non-opening area (NOP) can be located in the active area (A/A) of the display panel.

The correspondence of an area to another area may mean a relationship in which the one area and the another area are considered to be the same, taking into account tolerance that may occur in the manufacturing process of a product.

As described above, since the anode electrode (ANO1, ANO2, ANO3), the bank layer (BNK), the organic light emitting layer (EL1, EL2, EL3) and the cathode electrode (CAT) are located over the overcoat layer (OC), light can be emitted from the opening area (OPN) in which the anode electrode (ANO1, ANO2, ANO3), the organic light emitting layer (EL1, EL2, EL3) and the cathode electrode (CAT) in the open area (BNKO) of the bank layer are sequentially disposed.

The display panel according to embodiments of the present disclosure can include a buffer layer (BUF), a interlayer insulating film (INF), a passivation layer (PAS), a transistor (TR), a storage capacitor (C1, C2), an auxiliary electrode (AE, or may be referred to as an auxiliary line) and a pad area.

The buffer layer (BUF) can be disposed on the substrate (SUB), and the transistor (TR) and the storage capacitor (C1, C2), and the like can be disposed over the buffer layer (BUF).

The interlayer insulating film (INF) can be located on a gate electrode (GATE) of the transistor (TR), an active layer (ACT), a first storage capacitor (C1) of the storage capacitor, and a first pad electrode (P1) of the pad area.

The passivation layer (PAS) can be disposed to protect electronic elements, such as the auxiliary electrode (AE), the storage capacitor (C1, C2), the transistor (TR), and the like.

The transistor (TR) can include the activation layer (ACT), a gate insulating film (GI), a gate electrode (GATE), a source electrode (S) and a drain electrode (D). Hereinafter, discussions are conducted on a transistor according to embodiments of the present disclosure. Typical implementations performed in the field of the present disclosure can be used to describe a location relationship between respective elements of the transistor in the present disclosure.

The activation layer (ACT) can be disposed on the buffer layer (BUF).

The gate insulating film (GI) is disposed on the activation layer (ACT), and the gate electrode (GATE) is disposed on the gate insulating film (GI). Therefore, the gate insulating film (GI) can be located between the activation layer (ACT) and the gate electrode (GATE).

Each of the source electrode (S) and the drain electrode (D) can contact respective portions of the activation layer ACT, and be disposed spaced apart from each other. The drain electrode (D) can be connected to the anode electrode (ANO) through a contact hole.

The transistor (TR) can function as a driving transistor (DRT) included in the panel, and drive the OLED included in the panel.

As shown in FIG. 4, the storage capacitor (C1, C2) can be disposed in the active area (A/A). The storage capacitor (C1, C2) can include a first storage capacitor electrode (C1) disposed in an identical layer to the gate electrode (GATE) and a second storage capacitor electrode (C2) disposed in an identical layer to the source electrode (S) and the drain electrode (D), but the structure of the storage capacitors (C1, C2) of the present disclosure is not limited thereto.

In addition, the display panel according to embodiments of the present disclosure can include a pad area disposed in the non-active area. A plurality of pad electrodes (P1 and P2) can be disposed in the pad area.

For example, a first pad electrode (P1) can be disposed on the plurality of insulating films (BUF, GI) disposed in the pad area. The interlayer insulating film (INF) can be disposed on the first pad electrode (P1), a part of the top surface of which is not covered by the first pad electrode (P1). A second pad electrode (P2) that contacts the first pad electrode (P1) can be disposed over the first pad electrode (P1) and the interlayer insulating film (INF).

In addition, various circuit films, or the like can be electrically connected to the second pad electrode (P2).

Figure 5:
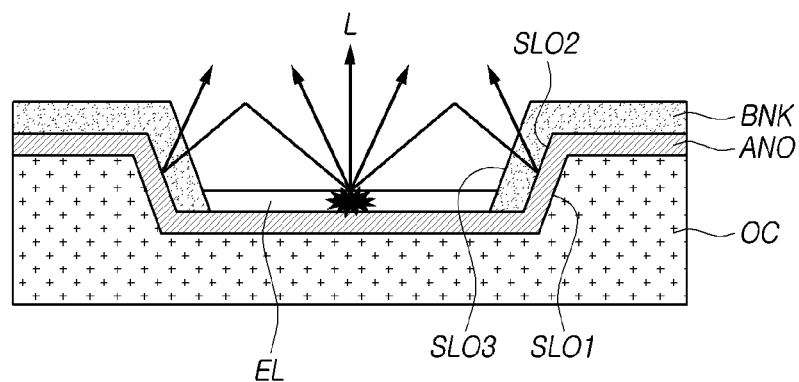
FIG. 5 is a view illustrating that light emitted from any subpixel of the display panel is reflected from a second inclined surface according to embodiments of the present disclosure.

FIG. 5 is a view illustrating how light emitted from any subpixel of the display panel can travel according to embodiments of the present disclosure. The subpixel shown in FIG. 5 is a subpixel including the first inclined surface (SLO1), the second inclined surface (SLO2) and the third inclined surface (SLO3)

Referring to FIG. 5, light (L) emitted from an organic light emitting layer (EL) is emitted in various directions without directivity in a specific direction. The organic light emitting layer (EL) can be one of the first organic light emitting layer (EL1), second organic light emitting layer (EL2) and the third organic light emitting layer (EL3), and as described above, is an organic light emitting layer included in the subpixel including the first inclined surface (SLO1), the second inclined surface (SLO2) and the third inclined surface (SLO3). Some of light emitted from the organic light emitting layer (EL) may be totally reflected and travel toward third inclined surface (SLO3) of the bank layer (BNK), while traveling from a layer with a high refractive index to a layer with a low refractive index.

The bank layer (BNK) is formed of a material with a certain range of transmittance to light in a visible light wavelength range. Accordingly, some light emitted toward the third inclined surface (SLO3) of the bank layer (BNK) can travel through the third inclined surface (SLO3) of the bank layer (BNK), and then reach the second inclined surface (SLO2) of the anode electrode (ANO). The anode electrode (ANO) is also one of the first anode electrode (ANO1) to the third anode electrode (ANO3). It should be understood that the anode electrode (ANO) is an anode electrode included in a subpixel including the first, second and third inclined surfaces. In other words, the structure can utilize the three different inclined surfaces from existing layers to provide three more chances to reflect light out of the device, thus improving light extraction without increasing the thickness of the device and without requiring separate reflective structures (e.g., edges of the overcoat layer, anode electrode and bank layer can be leveraged to provide additional functions, such as light extraction and reflection, and color shifting).

Light having reached the second inclined surface (SLO2) of the anode electrode (ANO) is reflected from the second inclined surface (SLO2), and then may travel toward the third inclined surface (SLO3) of the bank layer (BNK) and travel out of the display panel. Accordingly, as described above, in the display panel according to embodiments of the present disclosure, the second inclined surface (SLO2) of the anode electrode formed on the first inclined surface (SLO1) enables light emitted from the organic light emitting layer (EL) to travel toward an upper portion of the display panel, resulting in the luminous efficiency of the display panel being improved.

Figure 6:
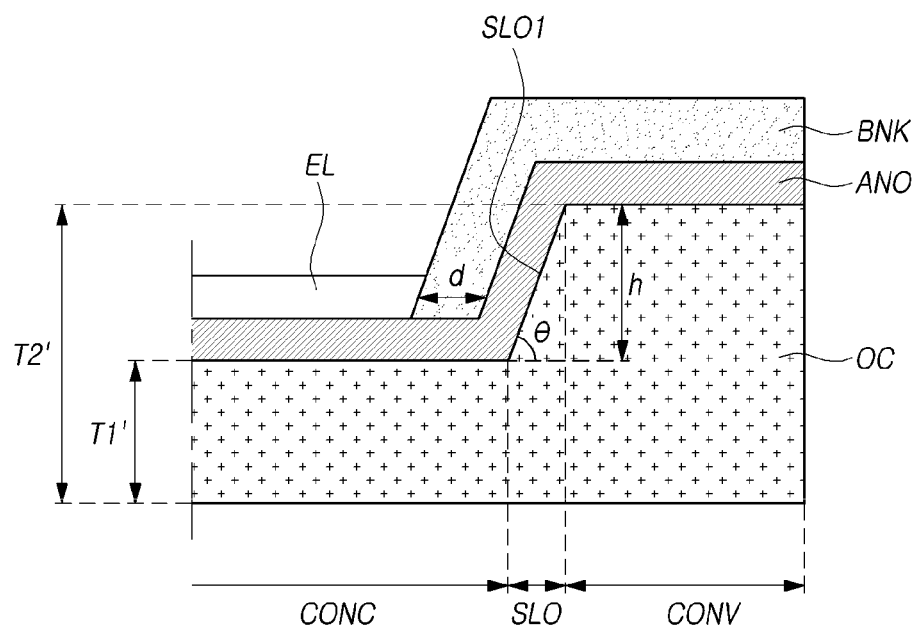
FIG. 6 is an enlarged cross-sectional view illustrating a part of the subpixel shown in FIG. 5 according to embodiments of the present disclosure.

FIG. 6 is an enlarged cross-sectional view illustrating a part of the subpixel shown in FIG. 5 according to embodiments of the present disclosure.

Referring to FIG. 6, an angle ($\theta$) between the concave area (CONC) and the first inclined surface (SLO1) is represented as $\theta$ (hereinafter, referred to as "$\theta$"), a distance between the second inclined surface (SLO2) and the third inclined surface (SLO3) is represented as d (hereinafter, referred to as "d"), and a height of the first inclined surface (SLO1) is represented as h (hereinafter, referred to as "h"). According to embodiments of the present disclosure, it is possible to provide a display panel with increased luminous efficiency by adjusting two or more of the $\theta$, the d and the h. For example, the display panel according to embodiments of the present disclosure can have specific values of θ and d, or specific values of θ, d and h.

The angle (θ) between the concave area (CONC) and the first inclined surface (SLO1) can be greater than or equal to 27°, or 45°. As the θ has a larger value, the second inclined surface (SLO2) can more effectively reflect light emitted from the organic light emitting layer (EL) formed on the anode electrode (ANO) not covered by the open area (BNKO) of the bank. There is no restriction to the upper limit of a range of the θ. In this situation, the possibility that cracks and breaks occur in the anode electrode (ANO) formed on the overcoat layer increases, as the θ has a larger value. Accordingly, the upper limit may be preferably less than or equal to 80°, 70°, or 65°. For example, the angle θ can be in a range of approximately 27° to 80°.

The d that is the distance between the second inclined surface (SLO2) and the third inclined surface (SLO3) can be defined as a distance from the second inclined surface (SLO2) to the third inclined surface (SLO3), measured in a parallel direction to the first area (A1) of the overcoat layer. The d can be less than or equal to 3.2 μm, 2.6 μm or 2.0 μm. The smaller the d is, the greater the opening area (OPN) of the display panel expands. In this situation, traveling paths of reflected light from reflecting by the second inclined surface (SLO2) to being extracted to outside of the display panel may reduce and thus luminous efficiency may increase. To this end, there is no restriction to the lower limit of the d. The lower limit of the d may be preferably greater than or equal to 0.1 μm, 0.3 μm, or 0.5 μm. For example, the distanced can be in a range of approximately 0.1 μm to 3.2 μm.

By adjusting the d within this range, it is possible to expand an opening area and to provide a display panel with increased luminous efficiency.

The h that is the height of the first inclined surface (SLO1) denote a difference between a thickness (T1') of the concave area (CONC) and a thickness (T2') of the convex area (CONV), which are connected by the first inclined surface (SLO1). The thickness (T1') of the concave area (CONC) can be a thickness of the concave area (CONC) measured at the beginning of the first inclined surface (SLO1). The thickness (T2') of the convex area (CONV) can be a thickness of the convex area (CONV) measured at the end of the second inclined surface (SLO2).

The h can be preferably greater than or equal to 0.7 μm, 1.2 μm, 1.4 μm, or 2 μm. The larger the h is, the greater the luminous efficiency increases because light emitted from the organic light emitting layer (EL) is reflected effectively by the second inclined surface (SLO2). To this end, there is no restriction to the upper limit of the h. The upper limit may be preferably less than or equal to 10 μm, or 5 μm. For example, the height h can be in a range of approximately 0.7 μm to 10 μm.

As described above, by adjusting the d, the θ and the h, the display panel according to the present disclosure can provide increased luminous efficiency and can include the first light emitting area and the second light emitting area when the organic light emitting layer emits light.

Figure 7A:
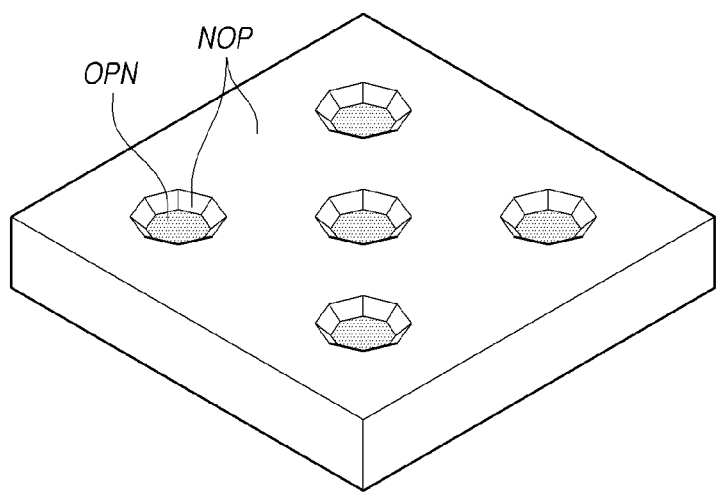
FIGS. 7A and 7B illustrate the display panel including an opening area, a non-opening area, a first light emitting area, and a second light emitting area according to embodiments of the present disclosure.
Figure 7B:
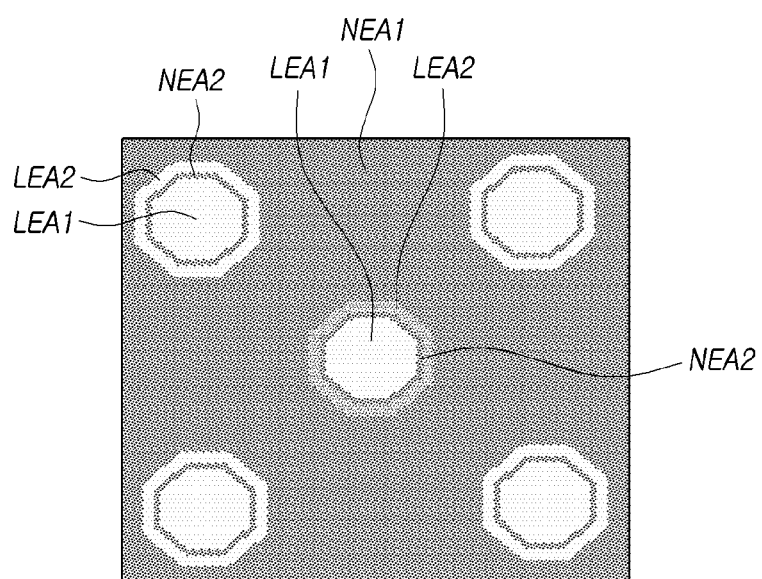

FIGS. 7A and 7B show views illustrating the display panel including an opening area, a non-opening area, a first light emitting area, and a second light emitting area according to embodiments of the present disclosure.

FIG. 7A shows a photomicrograph of the display panel including an opening area (OPN) and a non-opening area (NOP) having a specific shape. FIG. 7B shows a photomicrograph taken when the organic light emitting layer (EL1, EL2, EL3) of the display panel emits light. All subpixels shown in FIG. 7A include the first inclined surface (SLO1) to the third inclined surface (SLO3).

Referring to FIG. 7, the display panel according to the present disclosure can include a first light emitting area (LEA1) and a second light emitting area (LEA2), in which visible light is emitted when the organic light emitting layer emits light, and a first non-light emitting area (NEA1) and a second non-light emitting area (NEA2).

The second non-light emitting area (NEA2) is included in a subpixel including the first inclined surface (SLO1), the second inclined surface (SLO2) and the third inclined surface (SLO3). A subpixel not including the first inclined surface (SLO1) to the third inclined surface (SLO3) includes only the first light emitting area, but does not include the second light emitting area. Accordingly, all of the subpixels of the display panel shown in FIG. 7 include the first inclined surface (SLO1), the second inclined surface (SLO2) and the third inclined surface (SLO3).

The first light emitting area (LEA1) can have a shape corresponding to a shape of the opening area (OPN). The correspondence of a shape of an element to a shape of another element can mean that i) the shape of the element is an identical shape to the another element, ii) two elements have an identical shape, but have different sizes from each other, or iii) the shape of the element can be formed by transferring the shape of the another element. Accordingly, the shape of the first light emitting area (LEA1) can mean that the shape of the opening area (OPN) is substantially transferred by light emitted from the organic light emitting layer (EL1, EL2, EL3) located in the opening area (OPN).

There is no restriction to a shape of the opening area (OPN). The shape of the opening area (OPN) can preferably be, but not limited to, a polygonal shape, such as a circle or a square, a pentagon, and an octagon. Referring to FIG. 7A, the opening area (OPN) has a shape corresponding to the octagon.

The first light emitting area (LEA1) can have a shape corresponding to the opening area (OPN). Referring to FIG. 7B, the first light emitting area (LEA1) has a shape corresponding to the shape of opening area (OPN) as shown in FIG. 7A.

The second light emitting area (LEA2) does not overlap the first light emitting area (LEA1). The second light emitting area (LEA2) can have a shape corresponding to a shape of an edge of the first light emitting area (LEA1). As shown in FIG. 7B, the second light emitting area (LEA2) has an identical shape to the edge of the first light emitting area (LEA1), but has different size from the first light emitting area (LEA1). Therefore, it is possible to express that the second light emitting area (LEA2) has a shape corresponding to the edge shape of the first light emitting area (LEA1).

The second light emitting area (LEA2) can be a closed curve having an identical shape to the edge of the first light emitting area (LEA1). For another example, the second light emitting area (LEA2) can have a shape in which a part of the closed curve is disconnected. It is possible to determine whether the second light emitting area (LEA2) is disconnected, depending on a wavelength of visible light emitted from an organic light emitting layer included in a subpixel.

At least one subpixel can be distinguished by the first light emitting area (LEA1). Referring to FIG. 7B, each of a plurality of second light emitting areas (LEA2) can be spaced apart from one another by the first non-light emitting area (NEA1). That is, the first non-light emitting area (NEA1) can be an area between the second light emitting areas (LEA2) in the non-opening area (NOP).

That is, the first non-light emitting area (NEA1) can be substantially an area in which light emitting is not performed. That is, the first non-light emitting area (NEA1) can correspond to a part of the non-opening area (NOP), in which the second light emitting area (LEA2) is not formed, A light emitting area formed in one subpixel can be divided into the first light emitting area (LEA1) and the second light emitting area (LEA2) by the second non-light emitting area (NEA2). The second non-light emitting area (NEA2) may be an area in which light emitting is not substantially performed.

A shape of the second non-light emitting area (NEA2) may be determined depending on the shapes of the first light emitting area (LEA1) and the second light emitting area (LEA2). For example, in a situation where the first light emitting area (LEA1) has an octagon shape, and the second light emitting area (LEA2) has a closed curve with the octagon shape, the second non-light emitting area (NEA2) can have the octagon shape by the first light emitting area (LEA1) and the second light emitting area (LEA2).

Although the second non-light emitting area (NEA2) is described using the term of non-light emitting, it is possible for some light to be detected in the photograph because the second non-light emitting area (NEA2) is located between the light emitting areas (LEA1 and LEA2). In particular, it is possible for light with colors similar to a wavelength range of visible light emitted in the subpixel to be detected. Accordingly, the second non-light emitting area (NEA2) can be an area in which light emitting is not performed at all, or it should be understood that the second non-light emitting area (NEA2) can be an area in which light less than two light emitting areas is observed.

As described above, the second light emitting area (LEA2) can be implemented by adjusting a range of the θ, the d, or the h. Accordingly, the display panel according to embodiments of the present disclosure may have increased luminous efficiency and include the first light emitting area (LEA1) and the second light emitting area (LEA2), by adjusting a range of the θ, the d, or the h. For example, the second light emitting area (LEA2) can reflect light out of the device, which otherwise may not have been able to escape.

It is believed that the second light emitting area (LEA2) is formed by light traveling through paths described with reference to FIG. 5. The subpixel shown in FIG. 5 includes, as well as the first light emitting area (LEA1), the second light emitting area (LEA2) formed by light reflected from the second inclined surface (SLO2). Therefore, it is possible to provide the display panel with increased luminous efficiency. In accordance with embodiments of the present disclosure, the overcoat layer configured with the first inclined surface (SLO1) surrounding the concave area (CONC) is included in at least one of the first subpixel type to the third subpixel type, and thus it is possible to provide the display panel with enhanced luminous efficiency.

The second light emitting area (LEA2) can surround the first light emitting area (LEA1). In other words, the second light emitting area (LEA2) can be located all around the first light emitting area (LEA1). It is believed that this is because the second light emitting area (LEA2) is formed by light reflected from the second inclined surface (SLO2) of the anode electrode (ANO) formed on the first inclined surface (SLO1) surrounding the concave area (CONC).

In addition, the second light emitting area (LEA2) can be located in the non-opening area (NOP). As described above, since the second light emitting area (LEA2) is formed by light reflected from the second inclined surface (SLO2) located in the non-opening area (NOP), all or part of the second light emitting area (LEA2) can be located on the non-opening area (NOP).

As shown in FIG. 5, light forming the first light emitting area (LEA1) and the second light emitting area (LEA2) travels through different paths and different layers, and therefore corresponding color coordinates may be different. That is, light forming the second light emitting area (LEA2) travels through the bank layer (BNK) in the non-opening area (NOP), while the light forming the first light emitting area (LEA1) does not travel through the bank layer. The bank layer (BNK) may absorb a portion of the light of a part of the wavelength of light forming the second light emitting area (LEA2), and therefore, the light forming the second light emitting area (LEA2) may have different color coordinates from the light forming the first light emitting area (LEA1). Here, the difference of the color coordinates can mean that there is a difference that can be regarded as different, taking into account a typical error caused at the time of measuring the color coordinates.

Although the second non-light emitting area (NEA2) is described using the term of non-light emitting, it is possible for some light to be detected in the photograph because the second non-light emitting area (NEA2) is located between the light emitting areas (LEA1 and LEA2). In particular, it is possible for light with colors similar to a wavelength range of visible light emitted in the subpixel to be detected. Accordingly, the second non-light emitting area (NEA2) can be an area in which light emitting is not performed at all, or it should be understood that the second non-light emitting area (NEA2) can be an area in which light less than two light emitting areas is observed.

As shown in FIG. 7B, a plurality of the first light emitting areas and the second light emitting areas can be formed according to the number of subpixel areas included in the display panel, for example, the first subpixel, the second subpixel, the third subpixel, etc. Thus, it should be understood that the second light emitting area adjacent to the first light emitting area is a light emitting area included in an identical subpixel area, and denotes the second light emitting area adjacent to the first light emitting area of a plurality of the second light emitting areas. This is because a first light emitting area and a second light emitting area adjacent to the first light emitting area are located in one subpixel area, and a light emitting area is formed by light emitted from an identical organic light emitting layer.

Figure 8:
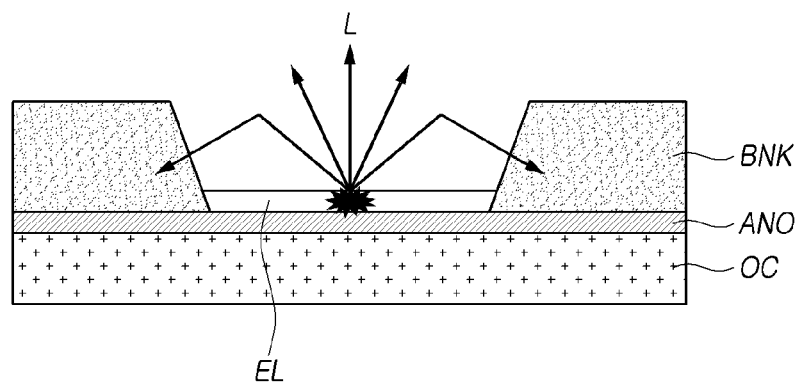
FIG. 8 is a view illustrating how light emitted from a subpixel of the display panel travels according to embodiments of the present disclosure.

FIG. 8 is a view illustrating that light emitted from a subpixel of the display panel travels according to embodiments of the present disclosure. Unlike the subpixel shown in FIGS. 5 and 6, the subpixel shown in FIG. 8 does not include the first inclined surface (SLO1) and the second inclined surface (SLO2). Accordingly, unlike the subpixels shown in FIGS. 5 and 6, the subpixel includes only the first light emitting area (LEA1) without the second light emitting area (LEA2) formed.

As described above, the subpixel having the structure shown in FIG. 5 includes the first light emitting area (LEA1) and the second light emitting area (LEA2), and light emitted from the second light emitting area (LEA2) has different color coordinates from light emitted from the first light emitting area (LEA1). Such a difference in the color coordinates results from a difference between a traveling path of light emitted from the first light emitting area (LEA1) and a traveling path of light emitted from the second light emitting area (LEA2). That is, a difference in traveling paths of the second light emitting area (LEA2) and the first light emitting area (LEA1) results in a variation in the color coordinates (e.g., a color shift).

Inventors of the present disclosure have observed that the variation of the color coordinates is affected by a wavelength range of light emitted from an organic light emitting layer. Accordingly, to prevent deterioration of the display panel due to the variation of the color coordinate, in the display including a first subpixel to a third subpixel (or, a first subpixel type to a third subpixel type) emitting a first color to a third color, i) at least one type of subpixel can include the first inclined surface (SLO1), ii) at least one of a first subpixel type and a second subpixel type can include the first inclined surface (SLO1), and iii) at least one of a first subpixel type and a second subpixel type can include the first inclined surface (SLO1) and a third subpixel type can be a type without the first inclined surface (SLO1). A subpixel including the first inclined surface (SLO1) can have a structure shown in FIG. 5, and a subpixel not including the first inclined surface (SLO1) can have a structure shown in FIG. 8. For example, the mixed subpixel types can help hide or avoid any detectable color shifts or undesirable color shifts.

The subpixel having structure shown in FIG. 8 can be a subpixel emitting light in a wavelength range in which a degree of color variation resulted from the forming of the second light emitting area is large.

For example, visible light of a first color emitted from the first subpixel can be red visible light, visible light of a second color emitted from the second subpixel can be green visible light, and visible light of a third color emitted from the third subpixel can be blue visible light.

The visible light of the red color can denote visible light typically recognized as red when viewed through the naked eye or a photographing device, for example, visible light having a wavelength range of 595 nm to 740 nm. The visible light of the green color can denote visible light typically recognized as green when viewed through the naked eye or a photographing device, for example, visible light having a wavelength range of 495 nm to 595 nm. The visible light of the blue color can denote visible light typically recognized as blue when viewed through the naked eye or a photographing device, for example, visible light having a wavelength range of 450 nm to 495 nm.

As described above, in the display panel according to embodiments of the present disclosure, the first inclined surface can be absent from a subpixel emitting a color resulting in a large color variation, but can be included in a subpixel emitting a color resulting in a small color variation, resulted from the forming of the second light emitting area. Thus, it is possible to provide the display panel with enhanced luminous efficiency, low quality deterioration according to angles of view, and an excellent color gamut.

In addition, the display panel according to embodiments of the present disclosure may be configured to adjust the θ, the d, and the h described above according to a color emitted from a subpixel.

In the display panel according to embodiments of the present disclosure, the overcoat layer may include the first inclined surface in at least two of the first subpixel type to the third subpixel type. An angle of the first inclined surface included in each of the first, second and third subpixel types can be different from one another. A distance between the second inclined surface and the third inclined surface in each of the first, second and third subpixel types can be different from one another.

In addition, in a situation where the overcoat layer includes the first inclined surface in at least two of the first subpixel type to the third subpixel type, a height of the first inclined surface included in each of the first, second and third subpixel types can be different from one another. Each type of subpixel can refer to a subpixel type that emits a different color from one another when a subpixel that emits light of a color is expressed as one type of subpixel.

Referring to FIG. 4, since the first subpixel (SP1) and the second subpixel (SP2) include the first inclined surface (SLO1), therefore, the display panel includes at least two of the first, second and third subpixel types. In addition, since each of the first subpixel (SP1) and the second subpixel (SP2) emits a different color, an angle (θ) of a first inclined surface included in the first subpixel (SP1) can be adjusted differently from an angle (θ) of a first inclined surface included in the second subpixel (SP2), taking into account characteristics of light of the different color. In addition, a distance (d) between the second inclined surface and the third inclined surface can be also adjusted differently for enabling a corresponding value measured in the first subpixel (SP1) to be different from a corresponding value measured in the second subpixel (SP2). A height (h) of the first inclined surface can be adjusted differently for enabling a height of a first inclined surface included in the first subpixel (SP1) to be different from a height of a first inclined surface included in the second subpixel (SP2). As described above, in the situation where the θ, the d and the h are adjusted differently depending on characteristics of the color of light emitted from each subpixel, it is possible to maximize light extraction efficiency (e.g., different colors may perform better with different settings for the θ, the d and the h, based on the corresponding wavelengths).

Figure 9:
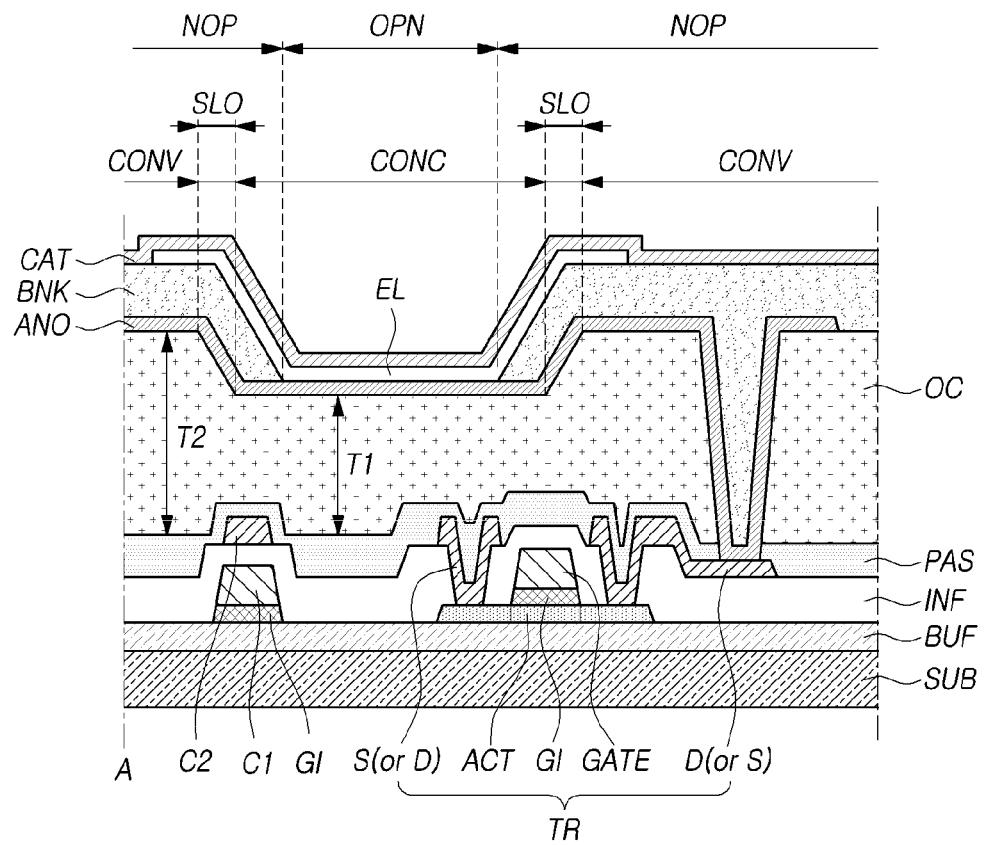
FIG. 9 is a cross-sectional view illustrating the display device according to embodiments of the present disclosure.

FIG. 9 is a cross-sectional view illustrating the display device according to embodiments of the present disclosure.

Referring to FIG. 9, the organic light emitting layer (EL) can be disposed on parts of the anode electrode (ANO) that are not covered by the open area (BNKO) of the bank layer and the bank layer (BNK), for example, extending from a portion on the anode electrode (ANO) that is not covered by the open area (BNKO) of the bank layer to a portion on the bank layer (BNK). The cathode electrode (CAT) can be located on the organic light emitting layer (EL). FIG. 9 shows that the organic light emitting layer (EL) covers the whole top surface of the bank layer (BNK), but embodiments of the present disclosure are not limited thereto. The organic light emitting layer (EL) can be disposed to cover the open area (BNKO) of the bank layer and a part of the top surface of the bank layer (BNK).

In the situation where the organic light emitting layer (EL) is disposed across both the opening area (OPN) (in which the bank layer (BNK) is not disposed) and parts of the non-opening area (NOP) (in which the bank layer (BNK) is disposed), it is possible to maximize an area of the organic light emitting layer (EL) in which light emitting is performed. In the situation where the organic light emitting layer (EL) is disposed in only the opening area (OPN) (e.g., not on parts of the bank layer), due to limitations in process, the organic light emitting layer (EL) may not be formed in an edge portion of the opening area (OPN) or may be incompletely formed. However as described above, when the organic light emitting layer (EL) is disposed on parts of the bank layer (BNK) as well, it is possible to overcome some problems with limitations in process.

Figure 10:
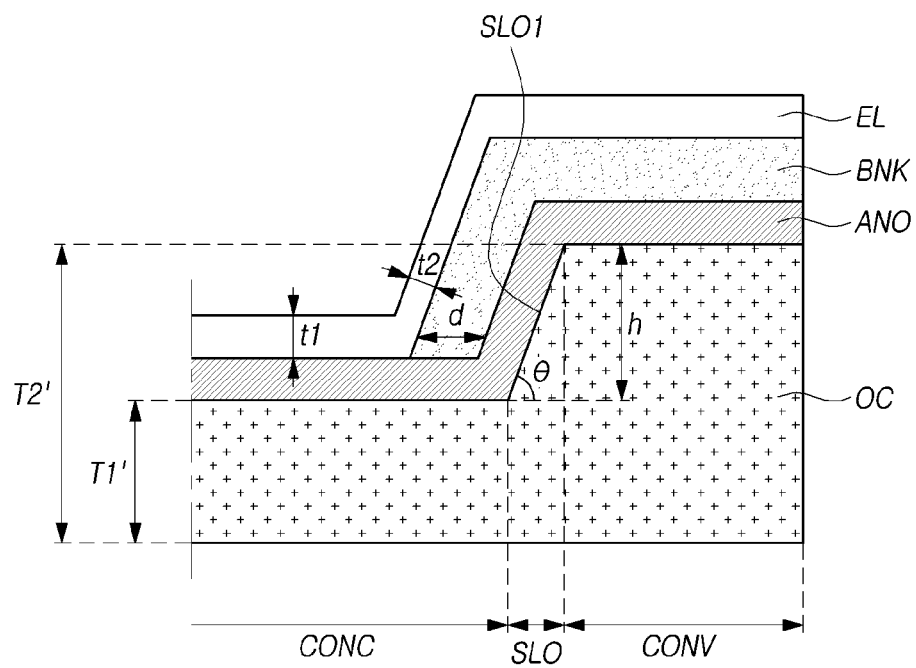
FIG. 10 is an enlarged cross-sectional view illustrating a part of the display device shown in FIG. 9 according to embodiments of the present disclosure.

FIG. 10 is an enlarged cross-sectional view illustrating a part of the display device shown in FIG. 9 according to embodiments of the present disclosure.

Referring to FIG. 10, a thickness (t1) of the organic light emitting layer (EL) disposed on the anode electrode (ANO) is larger than a thickness (t2) of the organic light emitting layer (EL) disposed on the third inclined surface (SLO3) of the bank layer (BNK).

The difference in the thicknesses of the organic light emitting layer can be caused by the third inclined surface (SLO3) of the bank layer (BNK). The organic light emitting layer (EL) can be formed by a thermal evaporation process, which is a physical vapor deposition technique. When the thermal evaporation process is used on the inclined surface, such as the third inclined surface (SLO3), the thickness of the deposited layer may reduce due to characteristics of the thermal deposition process, In a situation where a portion of the organic light emitting layer becomes thin, the density of carriers may increase at an electrode adjacent to the organic light emitting layer with the thin thickness and result in the organic light emitting layer being deteriorated. However, it is possible to prevent such problems in the display panel according to embodiments of the present disclosure because the bank layer (BNK) is located between the anode electrode (ANO) and the organic light emitting layer (EL), in a portion in which the organic light emitting layer (EL) has the thinned thickness (t2), as shown in FIG. 10. In other words, the bank layer can help separate the thin portion of the organic light emitting layer (EL) to be just far enough away (e.g., distance "d") from the anode so that the density of carriers at the thin part of the organic light emitting layer (EL) does not unduly increase and prevents the organic light emitting layer from being prematurely deteriorated.

The following Table 1 shows the observation on light emitting of the second light emitting area according to the variations of the θ, the d and the h in a subpixel including the first inclined surface. The subpixels used for observing whether the second light emitting area is formed in the Table 1 have the structure shown in FIG. 9.

TABLE 1

|  | θ(°) | h(μm) | d(μm) | Whether the second light emitting area is formed |
| --- | --- | --- | --- | --- |
| Comparative example 1 | 8 | 0.6 | 2 | X |
| Comparative example 2 | 25 | 1.7 | 2 | X |
| Comparative example 3 | 25.8 | 1.7 | 2 | X |
| Embodiment 1. | 45 | 1.4 | 2 | ○ |
| Embodiment 2. | 60 | 2 | 2 | ○ |
| Embodiment 3. | 60 | 2.04 | 2 | ○ |

Referring to the Table, 1, it is noted that the second light emitting area is formed when i) the θ is greater than or equal to 27°, 35°, or 45°, ii) the h is greater than or equal to 0.7 μm, 1.0 μm, or 1.4 μm, and iii) the d is less than or equal to 3.2 μm. Accordingly, the second light emitting area is formed in subpixels including the first inclined surface, and therefore, it is expected to exhibit excellent luminous efficiency.

The following Table 2 shows luminous efficiency, degradation of display quality of images according to angles of view, and a color gamut.

TABLE 2

|  |  | Comparative example 4 | Embodiment 4. | Embodiment 5. | Embodiment 6. |
| --- | --- | --- | --- | --- | --- |
| Color | Rx | 0.685 | 0.685 | 0.685 | 0.686 |
|  | Gx | 0.232 | 0.232 | 0.250 | 0.255 |
|  | By | 0.051 | 0.051 | 0.055 | 0.055 |
| Efficiency (cd/A) | W | 39.5 | 39.5 | 41.5 | 41.7 |
|  | R | 54.4 | 54.1 | 54.4 | 53.5 |
|  | G | 133 | 133 | 136.5 | 139.7 |
|  | B | 4.7 | 4.7 | 5.4 | 5.4 |
| Viewing Angle (θ: 0~60°) | Δu'v' (Typ.) | 0.027 | 0.024 | 0.023 | 0.0 |
|  | JND (White) | 15 | 14 | 12 | 12 |
| Color gamut (%) | DCI-P3 | 100 | 100 | 100 | 100 |

The Embodiments 4 to 6 and the Comparative example 4 are display panels including three types of subpixel, such as, a red subpixel, a green subpixel, and a blue subpixel. In Comparative example 4, all three types of subpixel do not include the first inclined surface, and each subpixel has a structure similar to that shown in FIG. 8. In the Embodiment 4, only the red subpixel includes the first inclined surface. In the Embodiment 5, only the green subpixel includes the first inclined surface. In the Embodiment 6, the red and green subpixels include the first inclined surface. In particular, the Embodiment 5 has the structure of FIG. 4, and the Embodiments 4 and 5 are the same as the Embodiment 6, except that only one type of subpixel has the first inclined surface.

Figure 11:
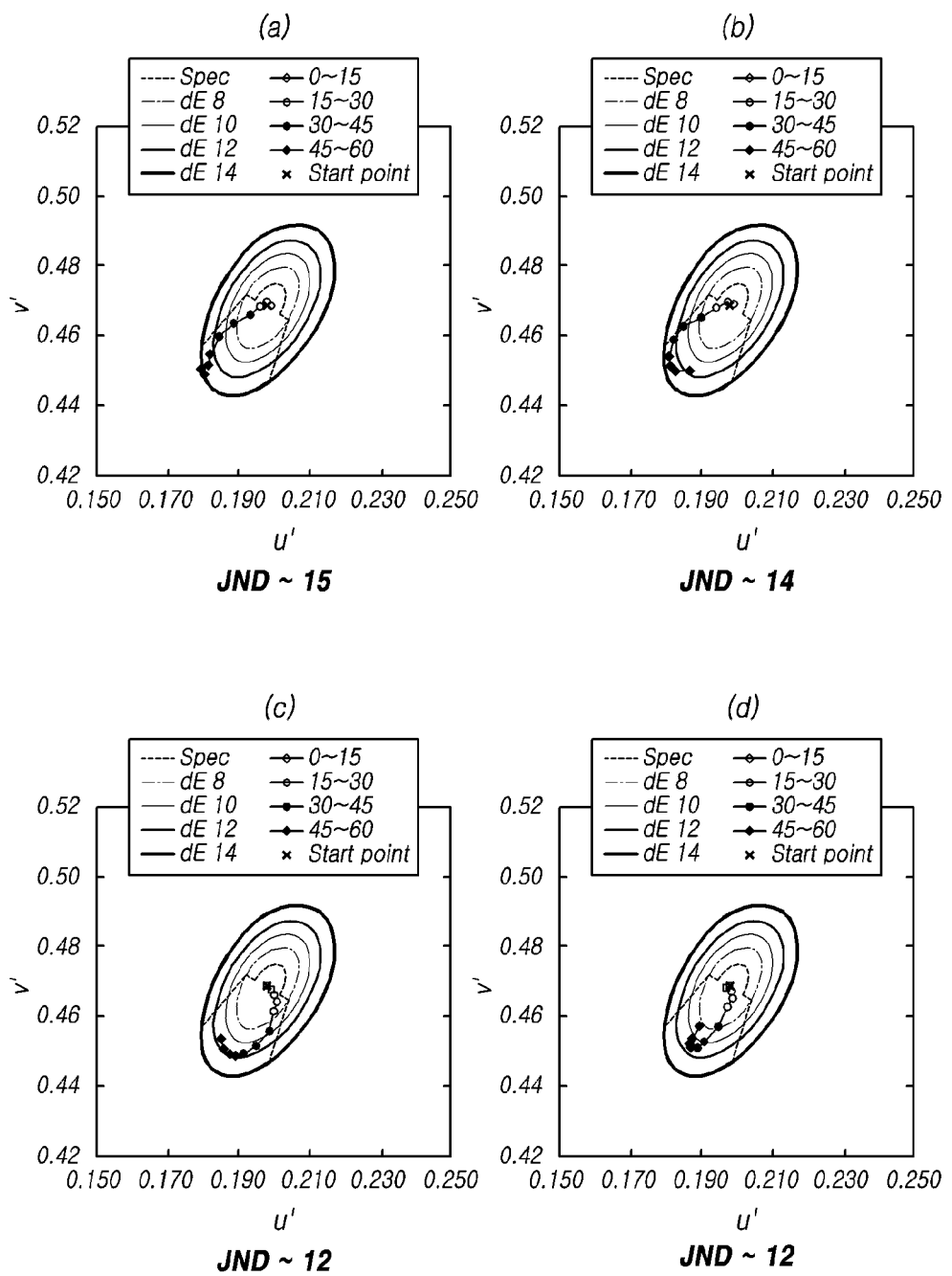
FIGS. 11(a)-(d) and 12(a)-(d) are views illustrating a degree of degradation of display quality of images according to different viewing angles of the display panel according to embodiments of the present disclosure.
Figure 12:
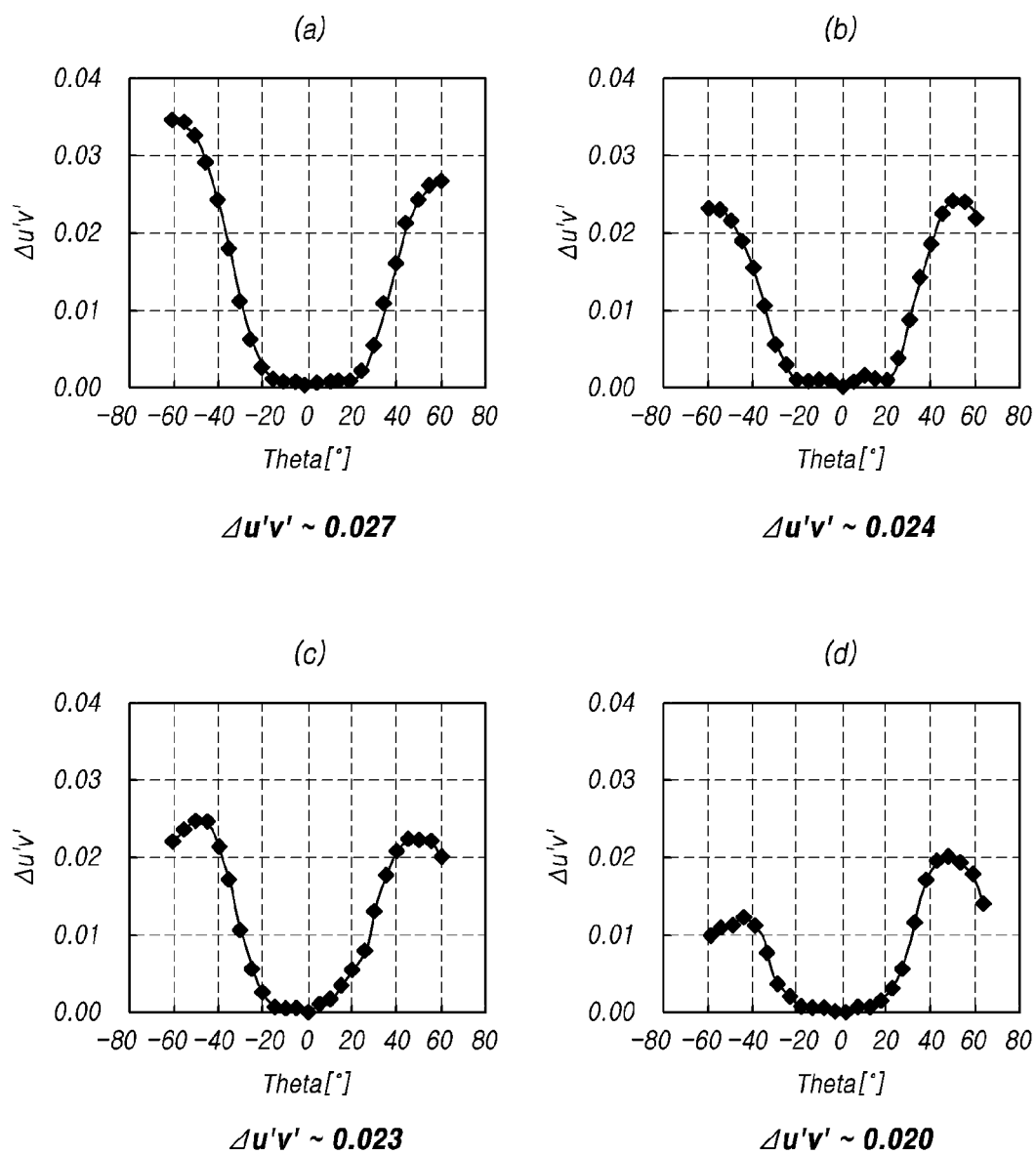

The deterioration of display quality of images according to angles of view shown in the Table 2 is illustrated in FIGS. 11 and 12. FIGS. 11(a) and 12(a) relate to the display panel of the Comparative example 4. FIGS. 11(b) and 12(b) relate to the Embodiment 4. FIGS. 11(c) and 12(c) relate to the Embodiment 5. FIGS. 11(d) and 12(d) relate to the Embodiment 6.

Referring to the Table 2 and FIGS. 11 and 12, a display panel having configurations of the Embodiments 4 to 6, in which at least one subpixel of the red subpixel and the green subpixel includes the first inclined surface, and the blue subpixel does not include the first inclined surface has enhanced luminous efficiency and low degradation of display quality of images according to angles of view, compared with a display panel having configurations of the Comparative example 4 in which all the subpixels do not include the first inclined surface.

Although embodiments of the present disclosure has been described for illustrative purposes, those skilled in the art will appreciate that various modifications, additions and substitutions are possible, without departing from the scope and spirit of the invention as disclosed in the accompanying claims. Although the example embodiments have been described for illustrative purposes, a person skilled in the art will appreciate that various modifications and applications are possible without departing from the essential characteristics of the present disclosure. For example, the specific components of the example embodiments can be variously modified. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display panel comprising:
a substrate including first, second and third subpixels;
an overcoat layer including a first inclined surface in at least one of the first, second and third subpixels;
first, second and third anode electrodes corresponding to the first, second and third subpixels, respectively, wherein at least one of the first, second and third anode electrodes includes a second inclined surface overlapping with the first inclined surface of the overcoat layer;
first, second and third organic light emitting layers disposed on the first, second and third anode electrodes, respectively; and
a bank layer disposed on the overcoat layer, the bank layer including a third inclined surface overlapping with both the first and second inclined surfaces of the overcoat layer and the at least one of the first, second and third anode electrodes,
wherein at least one of the first, second and third inclined surfaces is configured to reflect light emitted from a corresponding one of the first, second and third organic light emitting layers,
wherein a distance between the second inclined surface of the at least one of the first, second and third anode electrodes and the third inclined surface of the bank layer is in a range of approximately 0.1 μm to 3.2 μm, the distance being along a direction that is parallel to a lowermost surface of the bank layer in a corresponding subpixel among the first, second and third subpixels,
wherein a height of the first inclined surface of the overcoat layer is in a range of approximately 0.7 μm to 10 μm, the height being equal to a difference in height between two different upper surfaces of the overcoat layer in the corresponding subpixel along a direction that is perpendicular to the two different upper surfaces of the overcoat layer, and
wherein a corresponding light emitting layer among the first, second and third organic light emitting layers in the corresponding subpixel includes a thick light emitting layer portion disposed in a center of the corresponding subpixel and a thin light emitting layer portion disposed on the third inclined surface of the bank layer, the thin light emitting layer portion being thinner than the thick light emitting portion.

2. The display panel according to claim 1, wherein an angle between the first inclined surface of the overcoat layer and an imaginary line overlapping with and parallel to a lower surface of the corresponding one of the first, second and third organic light emitting layers is in a range of approximately 27° to 80°.

3. The display panel according to claim 1, wherein an interface between the bank layer and one of the first, second and third anode electrodes is configured to reflect light emitted from the corresponding one of the first, second and third organic light emitting layers out of the display panel, or
wherein an interface between one of the first, second and third anode electrodes and the overcoat layer is configured to reflect light emitted from the corresponding one of the first, second and third organic light emitting layers out of the display panel to generate color shifted light and reflect the color shifted light out of the display panel.

4. The display panel according to claim 1, wherein an interface between the bank layer and one of the first, second and third anode electrodes is configured to shift a color of light emitted from the corresponding one of the first, second and third organic light emitting layers to generate color shifted light, or
wherein an interface between one of the first, second and third anode electrodes and the overcoat layer is configured to shift a color of light emitted from the corresponding one of the first, second and third organic light emitting layers to generate color shifted light.

5. The display panel according to claim 1, wherein a portion of the bank layer is disposed between a portion of at least one of the first, second and third organic light emitting layers and the first and second inclined surfaces.

6. The display panel according to claim 1, wherein at least a portion of one of the first, second and third organic light emitting layers overlaps with the first, second and third inclined surfaces.

7. The display panel according to claim 1, wherein the overcoat layer includes the first inclined surface in at least two of the first, second and third subpixels, and
wherein the first inclined surface of the overcoat layer is absent from one of the first, second and third subpixels.

8. The display panel according to claim 1, wherein the display panel includes an opening area corresponding to an open area of the bank layer and a non-opening area corresponding to a remaining area except for the open area of the bank layer, and
wherein the at least one of the first, second and third subpixels having the first inclined surface, further includes:
a first light emitting area configured to emit visual light from a corresponding organic light emitting layer and having a shape corresponding to a shape of the opening area;
a second light emitting area configured to reflect a portion of the visual light emitted from the corresponding organic light emitting layer, the second light emitting area surrounding the first light emitting area without overlapping the first light emitting area, and having a shape corresponding to a shape of an edge of the first light emitting area;
a first non-light emitting area located outside of the second light emitting area; and
a second non-light emitting area located between the first light emitting area and the second light emitting area.

9. The display panel according to claim 8, wherein the second light emitting area is located in the non-opening area.

10. The display panel according to claim 8, wherein the second light emitting area corresponds to an interface between the bank layer and one of the first, second and third anode electrodes or an interface between one of the first, second and third anode electrodes and the overcoat layer.

11. The display panel according to claim 8, wherein color coordinates of visible light emitted from the first light emitting area is different from color coordinates of visible light emitted from the second light emitting area adjacent to the first light emitting area, and
wherein the visible light emitted from the first light emitting area and the visible light emitted from the second light emitting area both based on light emitted from the corresponding organic light emitting layer.

12. The display panel according to claim 1, wherein a portion of at least one of the first, second and third organic light emitting layers overlapping with a corresponding anode electrode is thicker than another portion of the at least one of the first, second and third organic light emitting layers overlapping with the third inclined surface of the bank layer.

13. The display panel according to claim 1, wherein a portion of the bank layer disposed between the third inclined surface of the bank layer and the second inclined surface of the at least one of the first, second and third anode electrodes has a thickness equal to the distance between the second inclined surface of the at least one of the first, second and third anode electrodes and the third inclined surface, and
the thickness of the portion of the bank layer is greater than a thickness of the thin light emitting layer portion disposed on the third inclined surface of the bank layer.

14. The display panel according to claim 13, wherein the height of the first inclined surface of the overcoat layer is greater than the distance between the second inclined surface of the at least one of the first, second and third anode electrodes and the third inclined surface of the bank layer, and
the distance between the second inclined surface of the at least one of the first, second and third anode electrodes and the third inclined surface of the bank layer is greater than the thickness of the thin light emitting layer portion disposed on the third inclined surface of the bank layer.

15. A display panel comprising:
a substrate including first, second and third subpixels;
an overcoat layer including a first inclined surface in each of the first, second and third subpixels;
first, second and third anode electrodes corresponding to the first, second and third subpixels, respectively, wherein each of the first and second anode electrodes includes a second inclined surface overlapping with the first inclined surface of the overcoat layer;
first, second and third organic light emitting layers disposed on the first, second and third anode electrodes, respectively; and
a bank layer disposed on the overcoat layer, the bank layer including a third inclined surface overlapping with both the first and second inclined surfaces of the overcoat layer and the at least one of the first, second and third anode electrodes,
wherein at least one of the first, second and third inclined surfaces is configured to reflect light emitted from a corresponding one of the first, second and third organic light emitting layers, and
wherein a maximum thickness of the bank layer along a perpendicular direction that is perpendicular to an uppermost surface of the bank layer in an area between the third inclined surface in the third subpixel and a top surface of the third anode electrode is greater than both a maximum thickness of the bank layer along the perpendicular direction in an area between the third inclined surface in the first subpixel and the second inclined surface of the first anode electrode, and a maximum thickness of the bank layer along the perpendicular direction in an area between the third inclined surface in the second subpixel and the second inclined surface of the second anode electrode.

16. The display panel according to claim 15, further comprising:
a first contact hole in the overcoat layer corresponding to the first subpixel;
a second contact hole in the overcoat layer corresponding to the second subpixel; and
a third contact hole in the overcoat layer corresponding to the third subpixel,
wherein the overcoat layer has a first thickness in areas overlapping with the first and second organic light emitting layers, and a second thickness in areas outside of the first and second organic light emitting layers adjacent to the first and second contact holes, respectively,
wherein the bank layer has a third thickness in an area overlapping with the third contact hole in the overcoat layer, and
wherein the third thickness is greater than the second thickness, and the second thickness is greater than the first thickness.

17. The display panel according to claim 15, wherein the first, second and third inclined surfaces in the first and second subpixels are parallel to each other, and
wherein the overcoat layer and the third anode electrode are flat in an area overlapping with the third inclined surface in the third subpixel.

18. The display panel according to claim 15, further comprising:
a first light emitting area and a second light emitting area in the first subpixel;
a first light emitting area and a second light emitting area in second subpixel; and
a first light emitting area in the third subpixel,
wherein the first light emitting areas in the first, second and third subpixels overlap with the first, second and third organic light emitting layers, respectively, and
wherein the second light emitting areas in the first and second subpixels overlap with the first, second and third inclined surfaces in the first and second subpixels, respectively.

19. The display panel according to claim 18, wherein the second light emitting area in the first subpixel emits a different color than the first light emitting area in the first subpixel.

20. A display device comprising:
the display panel of claim 15; and
a driving circuit configured to drive the display panel, the driving circuit including a data driver for driving a plurality of data lines and a gate driver for driving a plurality of gate lines.

* * * * *